US008000613B2

(12) United States Patent
Wong et al.

(10) Patent No.: US 8,000,613 B2
(45) Date of Patent: Aug. 16, 2011

(54) FLEXIBLE NANOWIRE SENSORS AND FIELD-EFFECT DEVICES FOR TESTING TONER

(75) Inventors: William S Wong, San Carlos, CA (US); Michael L Chabinyc, Goleta, CA (US); Sanjiv Sambandan, Palo Alto, CA (US); Pengfei Qi, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 449 days.

(21) Appl. No.: 12/338,310

(22) Filed: Dec. 18, 2008

(65) Prior Publication Data

US 2010/0158548 A1 Jun. 24, 2010

(51) Int. Cl.
*G03G 15/00* (2006.01)
*G01R 31/02* (2006.01)
*G01R 27/08* (2006.01)

(52) U.S. Cl. ................ 399/9; 324/72; 324/713; 399/27; 257/414

(58) Field of Classification Search ................ 399/9, 24, 399/27–29; 257/414; 324/71.1, 72, 452, 324/691, 693, 699, 715, 717
See application file for complete search history.

(56) References Cited

U.S. PATENT DOCUMENTS

| | | | | |
|---|---|---|---|---|
| 5,848,322 | A * | 12/1998 | Chen et al. | 399/57 |
| 2005/0117921 | A1 * | 6/2005 | Ishiguro et al. | 399/27 |
| 2006/0109011 | A1 * | 5/2006 | Uetake et al. | 324/663 |
| 2006/0237805 | A1 * | 10/2006 | Segal et al. | 257/414 |
| 2009/0161409 | A1 | 6/2009 | Wong | |
| 2009/0219035 | A1 | 9/2009 | Apte | |

OTHER PUBLICATIONS

McDermott, Joseph, et al., "Thin-Film Solid-State Lithium Battery for Body Worn Electronics", Mat. Res. Soc. Symp. Proc., vol. 736, Materials Research Society, 2003.
Sekitani, Tsuyoshi, et al., "A large-area flexible wireless power transmission sheet using printed plastic MEMS switches and organic field-effect transistors", Electron Devices Meeting, 2006, IEDM '06.
Wagner, R.S., et al., "Vapor-liquid-solid mechanism of single crystal growth", Applied Physics Letter, vol. 4, No. 5, 1964.
Kempa, Thomas, et al., "Single and Tandem Axiam p-i-n Nanowire Photovoltaic Devices" American Chemical Society, vol. 8, No. 10, 2008.
Arora, Aarti, et al., "Zinc oxide thin film-based MEMS acoustic sensor with tunnel for pressure compensation", Sensors and Actuators A vol. 141, pp. 256-261, 2008.
Graz, Ingrid, et al., "Flexible ferroelectret field-effect transistor for large -area sensor skins and microphones", America Inst. of Physics, vol. 89, 2006.
Ahn, J.H., et al., "Bendable integrated circuits on plastic substrates by use of printed ribbons of single-crystalline silicon", Applied Physics Letter, vol. 90, 2007.
Someya, Takao, et al., "Integration of Organic FETs with organic photodiodes for a large area, flexible, and lightweight sheet image scanners", IEE Trans. on Electron Devices, vol. 52, No. 11, 2005.
Setiadi, D., et al., "A pyroelectric polymer infrared sensor array with a charge amplifier readout", Sensors and Actuators, vol. 76, pp. 145-151, 1999.

* cited by examiner

*Primary Examiner* — David P Porta
*Assistant Examiner* — Jessica L Eley
(74) *Attorney, Agent, or Firm* — Blakely Sokoloff Taylor & Zafman

(57) ABSTRACT

A system, including an improved sensor, for determining toner particle uniformity is described. The sensor measures toner particle charge, typically be having the charge on the toner particle control a current flow through the channel of a thin film transistor. By measuring the charge on many toner particles, the system determines whether sufficient toner degradation has occurred that the toner should be replaced. The sensor is particularly suitable for being formed on a thin diagnostic sheet that is input through the paper path of a printing system.

21 Claims, 7 Drawing Sheets

FLEXIBLE NANOWIRE SENSORS AND FIELD-EFFECT DEVICES FOR TESTING TONER

CROSS-REFERENCE TO RELATED APPLICATION

This application is related to U.S. patent application Ser. No. 12/338,254, filed Dec. 18, 2008, entitled "Flexible Diagnostic Sensor Sheet;" filed by the same inventors and filed on the same day; the content of this related U.S. patent application is hereby incorporated by reference in its entirety.

BACKGROUND

Laser printers and Xerographic printers utilize charged toner to render an image on paper. Typically, the toner is charged and deposited on a charged drum in an image pattern. Toner that is to form part of the image is transferred to a charged sheet of paper or other material to be imaged. Toner that does not form part of the image is captured to be reused.

As toner is repeatedly charged, exposed to heat, and reused, the toner uniformity declines. In particular, the charge carrying capacity of the toner particles begins to change such that different toner particles have different physical characteristics resulting in different charge carrying capacities. Toner non-uniformity results in lower quality printer output.

Unfortunately, determining the optimum time to replace the toner is difficult. Counting the number of pages output is an inaccurate measure, because toner intensive printed pages will result in a quick consumption of toner and prevent substantial amounts of reused toner from being generated. Replacing the toner too early is wasteful and also increases printer operating costs. However, waiting too long to replace the toner can result in printer output degradation. Printing unusable output also results in waste.

Thus an improved method of measuring the decline in toner uniformity, or in general, determining when toner should be replaced, is needed.

SUMMARY

An improved sensor for determining the uniformity of printer toner particles is described. The system utilizes a sensor that includes a semiconductor channel. A region for receiving toner particles is formed above the channel. When a printer deposits a toner particle on the channel, a charge on the toner particle generates as an electric field that affects the channel conductivity. The change in channel conductivity changes a current flowing in the channel. The toner particle charge can be determined from the change in current.

Using the improved sensor in an array, the charge on numerous toner particles can be detected and compared. If the toner particle charges are not reasonably uniform, particularly, if the toner charges vary from a median by a significant deviation, an indication can be provided to change the toner.

DETAILED DESCRIPTION

A system for diagnosing printing systems that does not require integration of costly sensor systems in the printer is described. In one embodiment of the system, a flexible diagnostic sheet feeds into a printing system, much like paper. Electronics in the diagnostic sheet sense the state of printing components along the printer paper path. The information communicated by the diagnostic sheet is analyzed thereby enabling detection of problems in the printing system prior to visible manifestation of those problems in the printer output.

Figure 1:
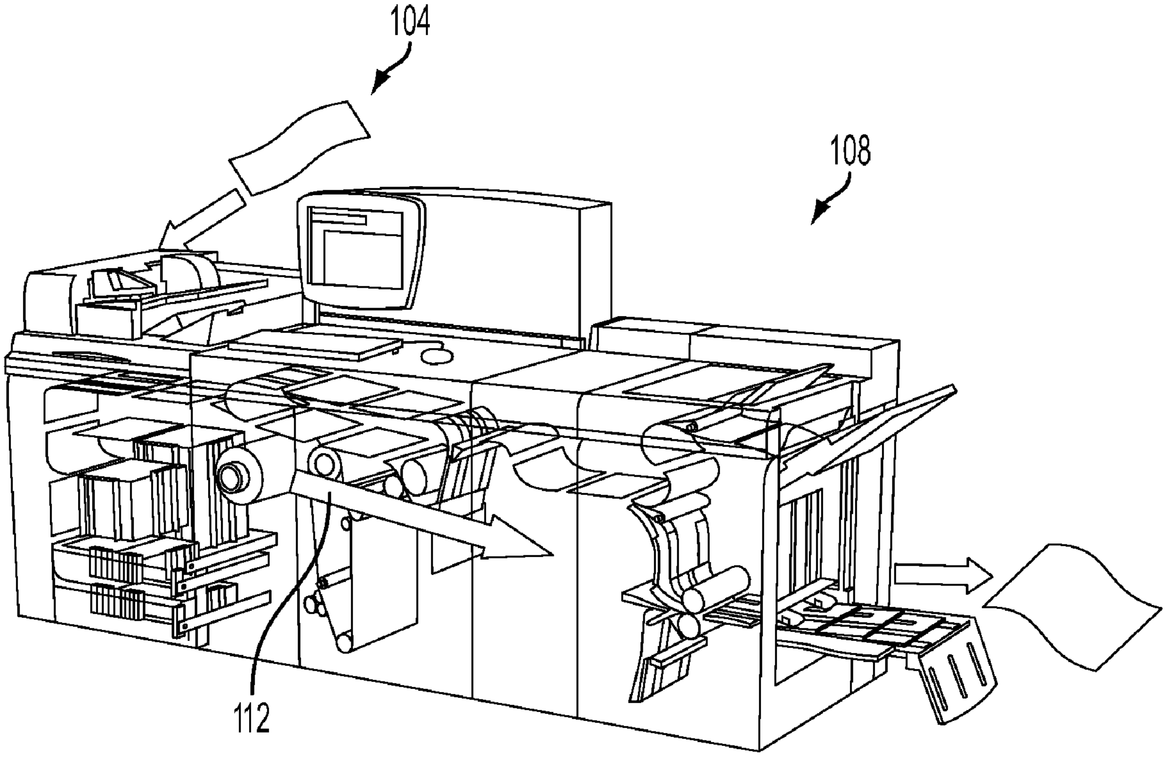
FIG. 1 shows a printer system set up to receive a flexible diagnostic sheet to test the various printer system components.
Figure 2:
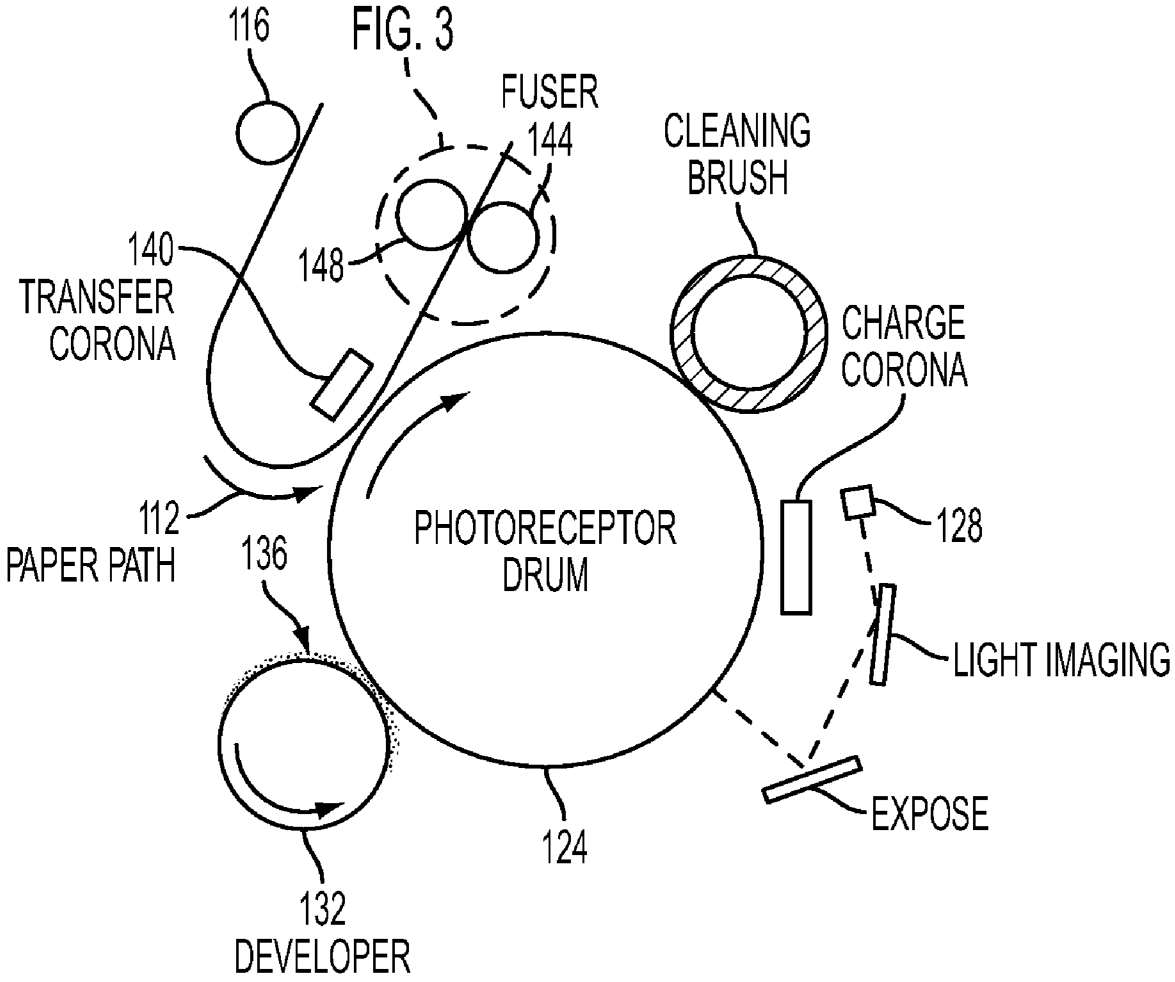
FIG. 2 shows an expanded view of the photoreceptor area of the printer system.
Figure 3:
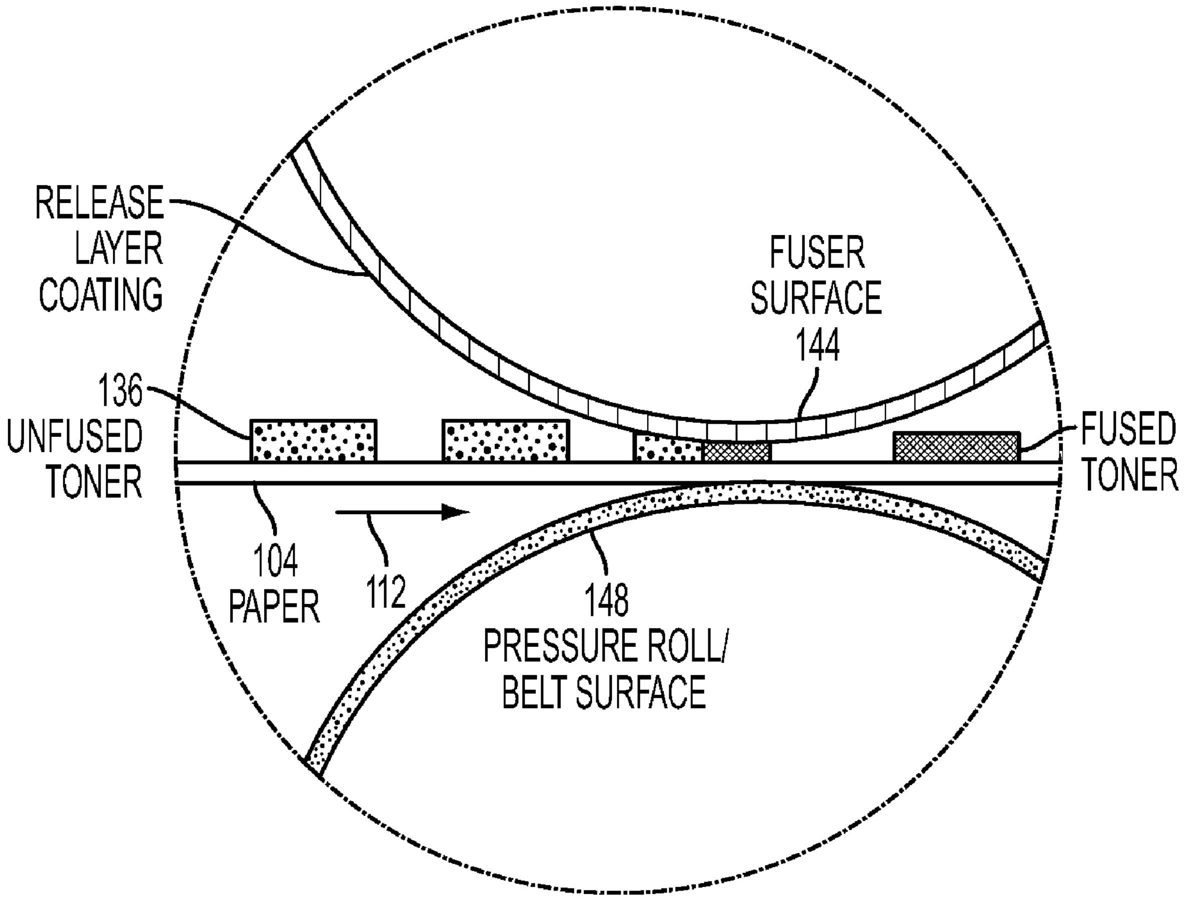
FIG. 3 shows an expanded view of the fuser and pressure roller area of the printer system.

FIG. 1 shows a flexible diagnostic sheet 104 being inserted into a printing system 108. FIGS. 2 and 3 show expanded views of various parts of the printing system 108. As used herein, "printer" and "printing systems" are broadly defined to include photocopying system, typically xerographic photocopying systems, as well as laser printers and output devices coupled to computer systems and/or networks. In the illustrated embodiments, the flexible diagnostic sheet 104 travels along a paper path 112 that approximately matches the paper path of a standard sheet of paper that is to receive a printed image. Rollers, such as paper handler rollers 116 of FIG. 2, move the flexible diagnostic sheet along the paper path.

In order to create an image, a corona wire or charge roller charges a photoconductive material coating a charging drum 124. A bright lamp, a LED or a laser 128 outputs light which is directed in a light pattern on the photoconductive material, the light pattern corresponding to an image to be printed. The light photons discharge to ground areas of the photoconductive material exposed to the light. Areas unexposed to light remain charged, typically negatively charged. Thus, an electrical charge pattern approximately matching a desired image is formed on the photoconductor surface of the charging drum 124.

A toner dispenser 132 deposits charged toner 136 on the charging drum. Toner 136 is attracted to the charged portions of the photoconductor surface. Because the charge distribution approximates a desired image, the toner distribution also approximately matches the same desired image.

In order to transfer the image from the charging drum 124 to a paper or diagnostic sheet, a charging mechanism 140 charges the paper or the flexible diagnostic sheet 104. When the sheet is brought into contact with the photoconductor surface of the drum, the toner transfers from the drum to the flexible diagnostic sheet 104.

After the image is transferred to the paper or diagnostic sheet, the image needs to be set. FIG. 3 shows using heat and pressure from pressure rollers 148 along with fuser oil distributed by elastomeric rollers 144 to fuse and fix the toner to the flexible diagnostic sheet 104. The preceding printing process when applied to paper instead of a diagnostic sheet is described in prior art printing references.

Figure 4:
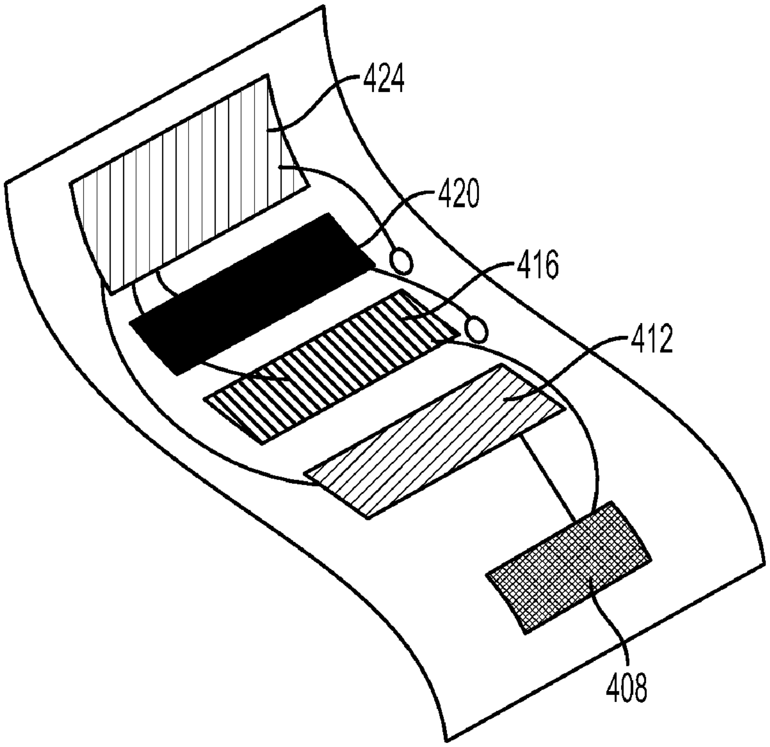
FIG. 4 shows an example diagnostic sheet.

FIG. 4 shows an example of a diagnostic sheet 404. The diagnostic sheet is designed to travel along the paper path of a sheet of paper being printed on, thus the sheet should have sufficient flexibility to travel along a standard printer paper path that includes many bends as shown in FIGS. 1-3. Furthermore, the flexible diagnostic sensor sheet thickness should be commensurate with paper to allow movement along the paper path. Thus a typical diagnostic sheet thickness is preferably less than around 500 microns.

To enable such thin diagnostic sheets, thin-film electronics are favored over conventional integrated circuits. The typical thickness of flexible electronics, such as polyimide and polyethylene naphthalate is on the order of 100 micro-meters. Example, amorphous-silicon thin film transistors can be less than 0.5 microns thick while ferroelectric polymer transducers can be less than 100 microns thick. Such organic or inorganic polymer transducers can be used to fabricate control electronics. The diagnostic sheet length and width may vary, but in order to pass easily through the paper handling system, the dimensions typically approximate a standard 8.5 inch width by 11 inch sheet of paper. This standard 8.5" by 11" sheet size is sufficient for the fabrication of large numbers of micro or millimeter scale electronic devices and sensors. Because typical printers can accept both plastic and paper sheets without any modification, typical printers should be able to handle such a thin and flexible diagnostic sheet without modification.

A power source 408 powers the sensors and other electronics on the diagnostic sheet. In one embodiment, the power source is an integrated thin film flexible battery such as that described in Thin-film solid-state lithium battery for body worn electronics by McDermott, J. (Infinite Power Solutions, Golden, Colo., USA); Brantner, P. C. Source: Electronics on Unconventional Substrates—Electrotextiles and Giant-Area Flexible Circuits. Symposium (Mater. Res. Soc. Symposium Proceedings Vol. 736), 2003, p 253-61. Other flexible and thin power sources that may be used include a super capacitor that is charged prior to sending the sheet through the printer, or a rf receiver that receives power transmitted wirelessly to the diagnostic sheet as it travels through the printer. An example of such a RF power source is provided in Tsuyoshi Sekitani, Makoto Takamiya, Yoshiaki Noguchi, Shintaro, Nakano, Yusaku Kato, Kazuki Hizu, Hiroshi Kawaguchi, Takayasu Sakurai, and Takao Someya in "A Large-Area Flexible Wireless Power Transmission Sheet using printed plastic MEMS switches and organic field-effect transistors" which is hereby incorporated by reference. Typical power source voltage requirements are low, typically only a few volts, and the current draw is usually very small; only that which is necessary to power the sensors in the sensor arrays such as illustrated arrays 412, 416, 420, and 424.

Figure 5:
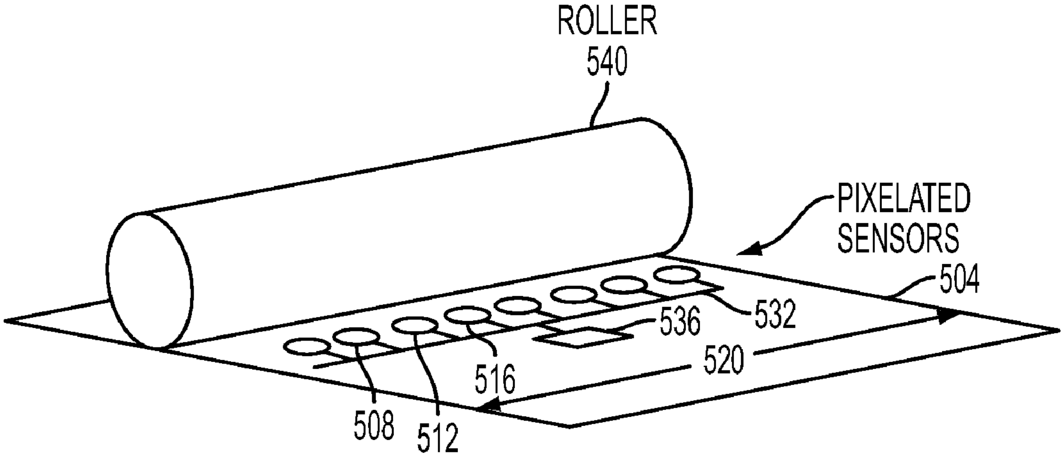
FIG. 5 shows a distribution of pixilated sensors on the example diagnostic sheet.

The sensors in the sensor array may be designed to detect a variety of parameters, including but not limited to temperature, pressure, charge, chemicals, humidity, acoustic energy (sounds) and the like. The sensor arrays typically include arrays of pixilated sensors distributed across an entire width of the flexible diagnostic sheet. FIG. 5 shows an example of pixilated sensors 508, 512, 516 distributed across width 520 of sensor sheet 504. Wires 532 couple each sensor to power source 536. The sensors may detect a variety of parameters such as the pressure applied by a pressure roller, the amount of fuser oil deposited onto the diagnostic sheet, and the uniformity of toner particles deposited on the diagnostic sheet.

Figure 6:
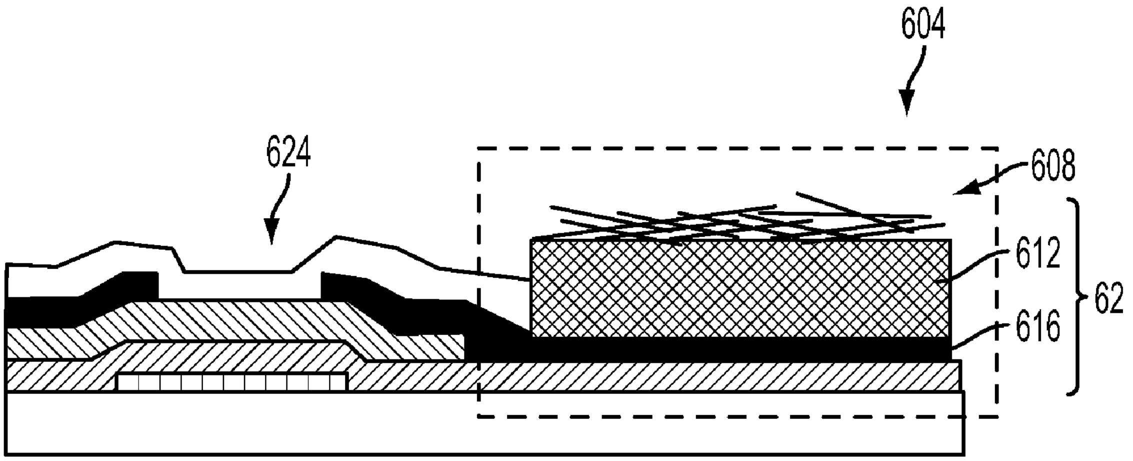
FIG. 6 shows an example of a capacitive oil sensor for use on the flexible diagnostic sheet.

FIG. 6 shows one example of a sensor to detect the quantity of fuser oil deposited onto the diagnostic sheet. In printer systems, elastomeric rollers are often coated with a release layer such as fuser release oil (hereinafter "fuser oil") to prevent the toner particles from transferring from the paper onto the roller surface. The fuser assembly fixes print toner onto the paper but typically, it is undesirable to get any fuser oil onto the paper. As the elastomeric roller, or other systems that heat and fix the toner degrades, excessive fuser oil is deposited thereby contaminating the printed page. This is a particular problem in duplex systems where the fuser oil contaminated page passes back through the system to print a second side and spreads the excess fuser oil on other printer components that should not have fuser oil. Thus, one application of the diagnostic sheet is to detect elastomeric roller failure prior to the visible appearance or excessive contamination of fuser oil on printed pages.

FIG. 6 shows a capacitive thin film oil sensor 604 that is thin, flexible and uses low amounts of power. Such sensors are particularly suitable for use in the diagnostic sheet. In the illustrated embodiment, oil sensor 604 includes a porous dielectric 612 positioned between a porous top electrode 608 and bottom electrode 616. The arrangement of electrodes and dielectric forms a parallel plate capacitor 620, although other capacitor geometries may be used. In one example, the porous top electrode is made from a matrix of conducting nanowires that form a mesh. In other embodiments, the top electrode may be made from a conventional metal thin film and the porous dielectric may be made from semiconducting or insulating nanowires or nanotubes, although a variety of materials may be used.

When printer components, such as an elastomeric roller, deposits oil on the top electrode, capillary action draws the oil into the porous dielectric 612 thereby changing the dielectric constant of the dielectric material 612. The change in dielectric constant changes the capacitor 620 capacitance.

To measure the capacitance, a thin film transistor (TFT) 624 biases the capacitor 620 to a specific voltage and measures the total charge needed to reach the specific voltage. Knowing the voltage and the charge on the capacitor enables determination of the capacitance using the relationship charge=Capacitance×voltage. The measured capacitance can be compared to the expected capacitance to determine whether excess oil has been deposited on the diagnostic sheet. In particular, the amount of oil absorbed can be determined by comparing the calibration capacitance curve with that of similar sensors.

The thin film oil sensor 604 shown in FIG. 6 can be implemented across a diagnostic sheet in a pixilated sensor array similar to that shown in FIG. 5. Varying the flexible diagnostic sheet thickness simulates pressure changes on rollers; thicker regions of the diagnostic sheet simulate thicker sheets of paper. In one embodiment, the flexible diagnostic sheet thickness changes across the length of the diagnostic sheet and fuser oil sensor are fabricated along the sheet length. Varying thicknesses and thus pressure changes the amount of fuser oil absorbed by the diagnostic sheet. Comparing the expected fuser oil absorbed at different pressures along the paper length provides additional information to enable more accurate assessment of the elastomeric roller's condition.

A second important parameter that often needs to be measured is the consistency of toner. As used herein toner consistency or toner uniformity is defined as the uniformity of toner particles. When manufactured, toner particles are of fairly consistent size and have very similar charge carrying capacities. However, in use, toner is charged, distributed across a drum and heated. Toner that is to form part of an image is transferred to the paper. Unused toner, meaning, toner that is not fixed to paper as part of an image, is captured and reused. As toner is reused, over time, toner uniformity declines. Nonuniformities in the toner, particularly in the amount of charge each toner particle carries, degrades print quality. Determining the extent of such degradation enables toner replacement at optimum intervals.

Figure 7:
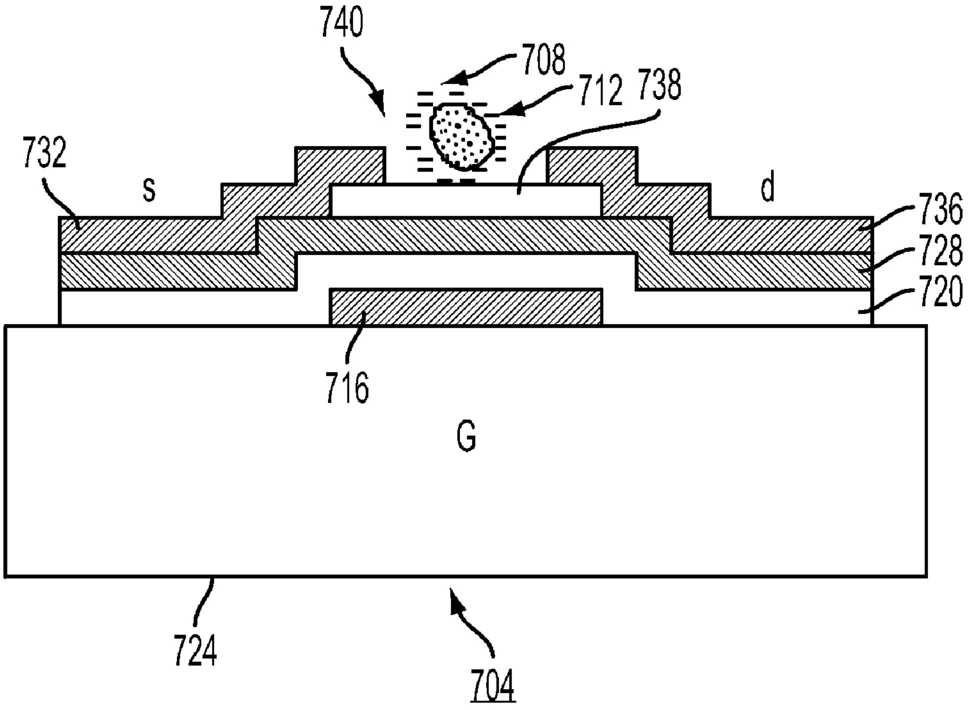
FIG. 7 shows an example field effect transistor (FET) set up to detect the charge on a toner particle for use on the flexible diagnostic sheet.

One method of determining toner uniformity is to measure and compare charge on the toner particles. FIG. 7 shows an example field effect transistor 704 (FET) used as a sensor to measure the charge 708 on a toner particle 712. The illustrated field effect transistor 704 includes a gate electrode 716 formed between a gate dielectric 720 and a substrate 724. The gate electrode 716 helps control the conductivity of a semiconductor layer 728 that serves as a FET channel formed over gate dielectric 720. The conductivity of the semiconductor layer 728 controls current flow between a source 732 and drain 736 formed on and over different ends of semiconductor layer 728.

A gap 740 between source 743 and drain 736 is designed to receive a charged toner particle 712. In one embodiment, a high-k dielectric, such as an insulating oxide 738 may be formed over semiconductor layer 728 to prevent discharge of the toner into semiconductor layer 728. The charge on the toner particle together with the charge on the gate generates a combined electric field that controls the conductivity of the FET channel in semiconductor layer 728. The IV characteristics of the transistor 704 at a given gate voltage is typically known. Measuring the IV characteristic of the FET with a toner particle in the gap and comparing the measured IV characteristic with the known IV characteristics at a given gate voltage enables determination of the toner charge. Another method to measure the change in the TFT characteristics is by measuring the charging and leakage of the pixel transistor during operation. The charging characteristics will change according to the additional field imparted by the charged particle and shown as a change in the stored charge in the TFT. The apparatus and method for this testing process is described in U.S. patent application Ser. No. 12/040,807 by Raj Apte entitled "Method and System for Improved Testing of Transistor Arrays" which is hereby incorporated by reference.

Figure 8A:
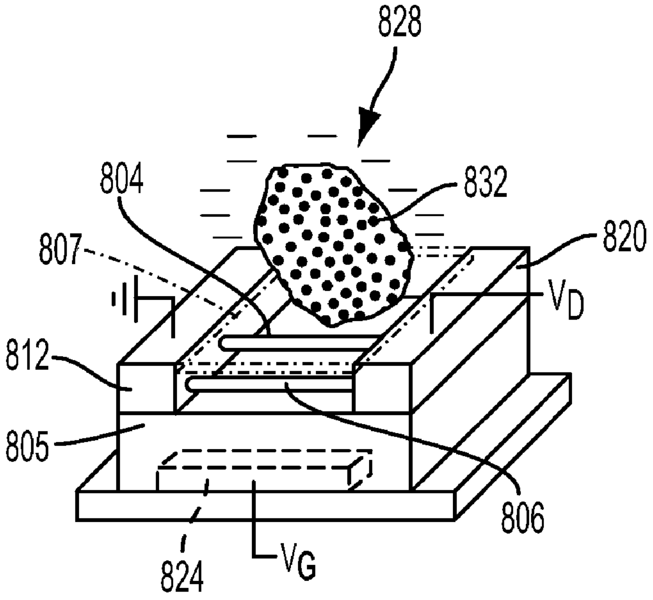
FIGS. 8A, 8B and 8C show various aspects of a TFT set up to detect the charge on a toner particle wherein the channel of the TFT is formed from a semiconductor nanowire
Figure 8B:
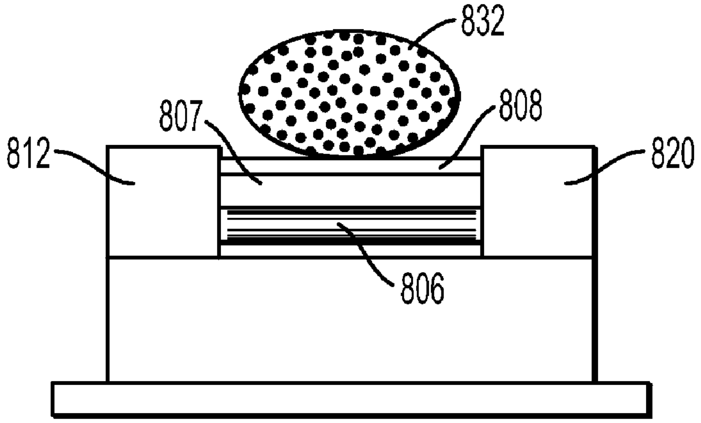
Figure 8C:
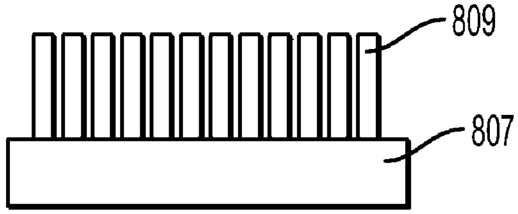

One difficulty of using the described FET structure is that a traditional FET may not offer sufficient mechanical flexibility to survive the flexing that occurs as the transistor is transported along the paper path. Silicon nanowires may be used to produce a more durable FET. FIG. 8A shows a perspective view and FIG. 8B shows a side cross-sectional view of a TFT that uses a nanowire, such as silicon nanowire 804, to form a TFT channel. In FIG. 8, the example silicon nanowire 804 is typically n-doped at a first end where it contacts a source contact 812, intrinsically doped in a center region where it forms a channel and then n-doped at an opposite end where it contacts a drain contact 820. The nanowire 804 is typically covered by or otherwise encapsulated by a dielectric layer 807. Dielectric layer 807 is preferably a high-K and thin dielectric to enable the maximum electric field from toner particles to reach the silicon nanowire channel. Below the source contact 812 and the drain contact 820 is a substrate 805.

A gate electrode 824 along with electrical charge 828 on toner particle 832 generates an electric field across the nanowire. The electric field determines the current flow through the nanowire. As previously described for a traditional FET, by knowing the change in current thorough the nanowires due to the electric field from the toner particle, the charge on the toner particle can be determined. This may be done by comparing the measured IV characteristic curves with the known characteristic curves. Or similarly, measuring the change in stored charge storage within the pixel TFT.

One method of further increasing the probability of capturing a toner particle in close proximity to the nanowire is to coat the areas between adjacent nanowires 804 and nanowire 806 with a coating or alternatively providing a coating 808 over an encapsulating thin-film layer such as dielectric layer 807. The coating increases the adhesion of the charged toner particle to the substrate. For example, when the coating is formed between adjacent nanowires, a positively charged polyelectrolyte can be used to attract negatively charged toner particles. Because toner particle 832 is substantially wider than the nanowire, the polyelectrolyte may be patterned to maintain sufficient distance from the nanowire such that the charge on the polyelectrolyte does not affect the nanowire conductance while still being in close enough proximity to the toner particle to exert an attractive force.

In an alternative embodiment, a coating such as coating 808 may cover dielectric layer 807 that covers or otherwise encapsulate the nanowires. In such cases, the effect of the coating should be taken into account. One method of doing so is to take into account the charge of the coating when measuring the current flow changes due to a toner particle charge. Another method is to use an ultra thin (typically less than 10 μm thick organic coating) functionalized surface coating. For example, atomic layer deposition may be used to form a trimethylaluminum surface. Exposure to organic alcohols (cyano- or vinyl-terminated alcohols) results in an organic layer with a dipolar or reactive functional group at the surface. Such a functional group such as functional group 809 illustrated in FIG. 8C can "capture" toner particles without significantly affecting the electric field at the nanowire.

Figure 9:
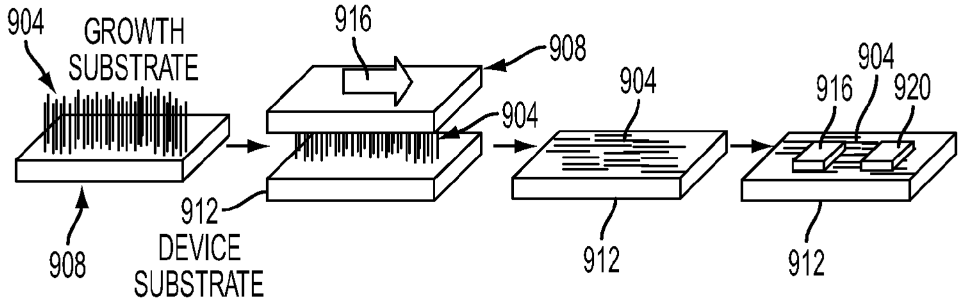
FIG. 9 shows a series of operations which may be used to form nanowires that form the channel of a TFT.

FIG. 9 shows one example method of forming the nanowire channel TFT. In FIG. 9, the nanowires 904 are grown on a growth substrate such as a silicon glass growth substrate 908. Example methods of growth include vapor-solid-liquid process which is described in _R. S. Wagner and W. C. Ellis, Appl. Phys. Lett. 4 (1964), p. 89. After growth, the nanowires 904 may be transferred to a device substrate 912 using direct contact and a mechanical shearing force along direction 916. The device substrate 912 is typically the dielectric that will eventually form gate dielectric such as gate dielectric 720 or gate dielectric 818. The shearing force removes the nanowire from the growth substrate 908 and orients the nanowires on device substrate 912. After positioning of the nanowires on the gate dielectric, source contact 916 and drain contact 920 may be formed on the device substrate 912 such that at least some of the nanowires form a channel running between the source contact and the drain contact.

Figure 10:
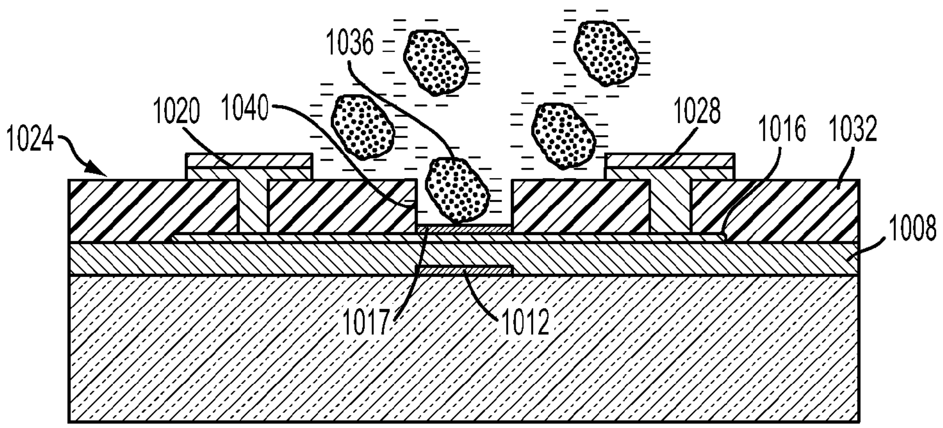
FIG. 10 shows a nanowire back channel TFT being configured for use as a toner particle charge sensor.

FIG. 10 shows an alternate configuration of a nanowire back-channel TFT being used as a charge sensor. In FIG. 10, a nanowire 1016 that forms the TFT channel is formed over gate dielectric 1008. A gate electrode 1012 that generates an electric field to control the flow of current through the TFT channel is formed over substrate 1004 and under gate dielectric 1008. A source contact 1020 formed through an encapsulation layer 1024 electrically couples to a first end of nanowire 1016 while a drain contact 1028 formed through a second encapsulation layer 1032 electrically couples to a second end of the nanowire. A high-k dielectric encapsulation layer 1017 protects the nanowire from direct contact with the charges on the toner particle.

Charged toner particle 1036 is captured in a gap 1040 or "sensor window" between the two encapsulation regions 1024, 1032. A cross sectional length of gap 1040 is typically between 10 to 20 microns, large enough to create a high probability of one toner particle being captured in the gap region but small enough to avoid capture of multiple toner particles at once in the gap region. The encapsulation layers of encapsulation regions 1024, 1032 are typically thick enough to create a well in the gap 1040 such that charged toner particles deposited on the encapsulation layers are kept at a distance such that the electric fields from these charged toner particles do not appreciably affect the conductance of the nanowire 1016.

As previous described, one method of further increasing the probability of single toner particle capture is to coat the areas between adjacent nanowires with a coating. The coating increases the adhesion of the charged toner particle to the substrate. For example, a positively charged polyelectrolyte can be used to attract negatively charged toner particles.

Figure 11:
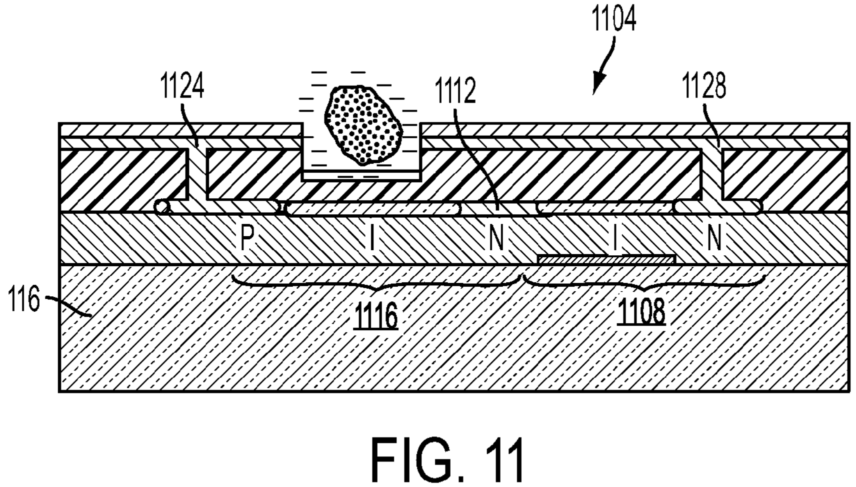
FIG. 11 shows an alternate embodiment of a nanowire TFT configured for use as a toner particle charge sensor.

FIG. 11 shows an alternative structure that may be used to determine toner quality. In FIG. 11, a light sensor 1104 determines whether a toner particle has been captured. When a toner particle is captured, the toner particle blocks light from reaching the light sensor. The gap that captures toner particles is treated such that given an expected toner charge, the probability of capturing a toner particle is approximately known. Example treatments that have been previously described include functionalized coatings or appropriately placed charged polyelectrolyte. The expected probability of capturing a toner particle can be compared to the percentage of such light sensors on the flexible sheet that actually do capture a toner particle. By comparing this percentage with the expected probability, an estimation of toner quality may be determined.

In the example of FIG. 11, a single horizontal nanowire structure includes a sensor 1104 coupled to a FET (field effect transistor structure 1108). In the illustrated configuration, the nanowire 1112 is doped to create a p-i-n sensor diode 1116 and a n-i-n FET structure 1120. Although a sensor coupled to a FET is shown, various different nanowire dopings may be used to create various other circuit elements. For example, an amplifier structure could be created by doping a segment of the light sensing p-i-n nanowire with a second segment doped n-i-n-i-n. Thus, although specific examples have been provided, the concept of doping a nanowire to create alternative circuit elements should not be limited to the examples provided.

In the structure of FIG. 11, source electrode 1124 and drain electrode 1128 provide current that flows along nanowire 1112. In the absence of a toner particle, the sensor diode 1116 is typically reverse biased preventing the flow of all but a low level leakage current. However, when a toner particle is deposited in the sensor window, the toner particle blocks light and thereby changes the reverse bias thereby allowing current to flow. As previously described, from the probability of capturing a toner particle with a particular charge know, the approximate charge on the particles may be estimated. Similar structures are used for light detection. One such structure is described in _T. J. Kempa, B. Tian, D. R. Kim, J. Hu, X. Zheng and C. M. Lieber, "Single and Tandem Axial p-i-n Nanowire Photovoltaic Devices," Nano Lett. 8, 3456-3460 (2008) which is hereby incorporated by reference. As in the structure of FIG. 10, the gap of the sensor window and the thickness of the encapsulation regions surrounding the sensor window are sized to maximize the probability that only a single toner particle will be captured in the sensor gap. The gap region may also be treated as previously described to improve the odds that a single toner particle will be captured in the gap.

Although the prior description accompanying FIGS. 6 through 11 describes the performance and use of a single sensor, it should be understood that typically a large number of these sensors will be used together in an array such as shown in FIG. 5. The size of the array may vary according to the statistical analysis that will be used to determine whether the toner needs to be placed. Typically, a large number of sensors (more than 50) will be used to enable the determination of the charge on a large number of toner particles. The charge on the many toner particles can then be compared. Typically, it is desired to keep the charge within a range. Toner charge that is too low will result in light images and toner charge that is too high will result in high background noise. Typical acceptable toner charges are between −10 and −50 μC/gram. Given an example toner particle of 10 micrometer radius with a density of 1 g/cc produces an approximate density of 4 ng/particle. Thus the example charge per toner particle will be approximately between $1\times10^{-14}$ to $5\times10^{-14}$ C/toner particle or $1\times10^{6}$ to $5\times10^{6}$ electrons/particle. Thus well above the typical noise level of 1000 electrons per sensor. However, if the charges on different toner particles varies widely or if the toner charge falls outside the desired range, the non-uniformity of toner particles results in a signal being transmitted to the end-user to replace or refresh the toner.

In order to save costs, a smaller number of sensors may be used. In such case, the charge on the detected toner particles can be compared with an expected toner charge rather than with each other. The number of deviations from an expected charge can be used to determine whether the toner needs to be replaced. Although there are cost savings associated with using a smaller number of sensors and comparing the sensor output with the expected output from new toner particles, those savings must be weighed against the benefit of using a large number of sensors to compare toner particles with each other. Comparing toner particles each enables continued use of toner when the toner particles uniformly degrade. Comparing toner particles with each other also enables changes in toner particle formulation without having to recalibrate the diagnostic system to account for any changes in the expected charge of new toner particles. Another embodiment would have the sensor directly mounted in the developer housing for constant monitoring of the toner charge. The sensor in this case may be fabricated on a flexible sheet that is then laminated onto the developer drum 132 of FIG. 2.

In addition to monitoring toner charge and fuser oil deposition, another useful parameter for printer diagnosis is measuring the sound produced by moving parts during operation. A printing system typically has a sound characteristic associated with each subsystem during normal operations. This normal "characteristic sound signature" can be a very useful diagnostic tool to verify that printer operation is being carried out within the normal desired operating parameters or under desired operating conditions.

In order to detect the sounds, some of the sensors on the diagnostic sheet may be acoustic sensors. Thin acoustic sensors may be fabricated using thin films of piezoelectric materials such as poly(vinylidene fluoride (PVDF). Acoustic pressure acting on the film surface gives rise to a piezoelectric effect to convert the acoustic pressure into an electrical signal, typically a voltage across the film. The voltage can be detected by electrodes coupled to the piezo surface. Such a sensor is described in "Zinc Oxide thin film-based MEMS acoustic sensor with tunnel for pressure compensation" by Aarti Arora et al., in *Sensors and Actuators*, A 141 (2008) pp 256-261 which is hereby incorporated by reference in its entirety.

Mounting the acoustic sensors on the diagnostic sheet passing through the printer or even inside the printer itself allows more "noise" free (due to the closer proximity to the subsystem being detected) detection of sounds. By monitoring sound from each subsystem during operation ad comparing the result to pre-defined "characteristic sound signatures" or optimal sound characteristic typically produced during normal operation, potential problems can be detected and/or diagnosed.

Mathematical analysis including Fourier Transforms or Spectral analysis of the detected sound can be used to facilitate comparison to the expected sound. Fourier analysis enables quick comparison of given waveforms, especially frequency components, to determine similarity. Large deviations from an expected sound waveform, and the type of deviation can be used to detect and diagnose printer problems. Example typical problems include improper toner loading into the toner drum, improper operation of the paper feeding mechanisms, paper jams, misalignment of drums in the printer assembly, etc.

Although acoustic, oil and toner charge sensors have been described in detail, the diagnostic sheet should not be limited to detecting the sound signature, amount of fuser oil and/or the uniformity of toner charge. Other printer parameters may be determined using corresponding sensors typically fabricated using thin film technology. For example, pressure distribution of a roller on the printed page may be detected using a pixilated thin elastomeric layer with embedded conducting particles. As pressure from the rollers is applied, a change in resistance of the elastomeric layer is detected. The change in resistance determines the amount of applied pressure.

Although the various sensors herein have been primarily described as being mounted on a diagnostic sheet traveling through a printer paper path, the sensors may also be mounted directly within the printer for more continuous monitoring. For example, the fuser oil detecting capacitor sensor could be mounted on a supplemental roller or other surface within the fuser assembly. The toner charge sensor may be mounted on various components within the printer that come into contact with toner, such as the developer housing. The acoustic sensors and pressure sensors may be mounted on printer components in close proximity to the source of acoustic sound or pressure.

Eventually, information detected by the sensor should be communicated to printer service personnel or the end user. Various methods may be utilized to communicate the information. In one embodiment, the information is transferred from the sensor to a memory device located on the diagnostic sheet. The printer itself may read out information from the memory device. Alternately, a device or computer to read out the information may be coupled to the diagnostic sheet after it exits the printer.

In an alternative method of transmitting the information, a RF transmitter may be included on the diagnostic sheet. The RF transmitter can transmit the data in real time to printer diagnostic circuitry or to a service person either while the diagnostic sheet travels along the paper path or soon after the diagnostic sheet is output from the printer.

Although details have been provided describing how to create a diagnostic sheet and how the diagnostic sheet can be used, such details have been provided to facilitate understanding and are not intended to serve as limitations for the claims provided herein. Instead, the claims, as originally presented and as they may be amended should be interpreted to encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. An apparatus for determining uniformity of electrical charge on printer toner particles, the apparatus comprising:
- a semiconductor channel; and
- a region for receiving a charged toner particle above the semiconductor channel, the toner particle to affect the conductivity of the channel and thus a current flowing in the channel, the change in current to enable determination of the charge on the toner particle.

2. The apparatus of claim 1 wherein the channel is formed by a plurality of semiconductor nanowires that run between a source electrode and a drain electrode.

3. The apparatus of claim 2 wherein a charged polyelectrolyte is maintained between adjacent nanowires that form the channel, the charged polyelectrolyte to attract charged toner particles.

4. The apparatus of claim 2 wherein the semiconductor nanowires are n-doped near the source electrode, intrinsic near a center region between the source electrode and drain electrode, and again n-doped near the drain electrode.

5. The apparatus of claim 1 wherein the semiconductor channel is in a well between two encapsulation layers, the well sized such that no more than one toner particle will fit into the well.

6. The apparatus of claim 5 wherein the encapsulation layers also serve as a source electrode and a drain electrode.

7. The apparatus of claim 5 wherein the well has a cross sectional length that measures between 5 and 20 micrometers.

8. The apparatus of claim 1 wherein the semiconductor channel is mounted on a flexible substrate that is to be fed into a printer system.

9. The apparatus of claim 1 wherein the apparatus further comprising:
- a source electrode positioned at a first end of the semiconductor channel; and,
- a drain electrode positioned at a second end of the semiconductor channel.

10. The apparatus of claim 1 further comprising:
- a gate electrode under the semiconductor channel, the gate electrode to produce an electric field that controls the electric field applied to the semiconductor channel in the absence of a charged toner particle.

11. An apparatus for detecting the presence of a toner particle comprising:
- a nanowire including a segment doped to form a p-i-n sensor; and
- a region above the segment of the nanowire doped to form a p-i-n sensor to capture a toner particle such that when the toner particle is captured, light is prevented from reaching the p-i-n sensor to indicate the presence of the toner particle.

12. The apparatus of claim 11 wherein the nanowire includes a second segment that is doped to form a second circuit element.

13. The apparatus of claim 12 wherein the second segment is n-i-n doped to form a field effect transistor.

14. The apparatus of claim 12 wherein the second segment is n-i-n-i-n doped to create an amplifier structure.

15. A method of measuring a charge on toner particle, comprising:
- inputting a flexible toner sensor into a printer;
- depositing toner on the flexible toner sensors such that at least one toner particle falls in close proximity to a channel region of the flexible toner sensor; and
- detecting the current change through the channel region and using the change in current to determine the charge on the at least one toner particle.

16. The method of claim 15 further comprising adjusting a charge on a gate electrode to bias the channel region to better determine the charge on the toner particle.

17. The method of claim 15 further comprising:
Inputting a second flexible toner sensor into a printer;
depositing a second toner particle on the second flexible toner sensor such that the second toner particle falls into a channel region of the second flexible toner sensor;
detecting the current change through the channel region of the second flexible toner sensor to determine a charge on the second toner particle; and,
comparing the charge on the first toner particle and the charge on the second toner particle to determine if toner uniformity is being maintained.

18. The method of claim 15 further comprising depositing printer fuser oil over the toner particle.

19. The method of claim 15 wherein the charge on the toner particle is compared with an expected charge, any deviation from the expected charge is used to analyze whether the toner needs to be recharged or replaced.

20. A method of making a sensor to determine uniformity of electrical charge on printer toner particles, comprising:
forming semiconductor nanowires to extend out of a substrate;
applying a shearing force to break the nanowires near the substrate and orient them in an approximately uniform direction on the substrate; and
forming a source electrode on one region of the substrate and a drain electrode on a second region of the substrate such that the nanowires form a channel running between the source electrode and the drain electrode, the channel being adjacent to a region to receive a charged toner particle above the channel, and having a current flowing in the channel, the change in the current enabling determination of the charge on the toner particle.

21. The method of claim 20 wherein the semiconductor nanowires are doped n-type in regions near the source electrode and also in regions near the drain electrode.

* * * * *